(12) United States Patent
Liu et al.

(10) Patent No.: US 10,689,247 B2
(45) Date of Patent: Jun. 23, 2020

(54) METHOD AND STRUCTURE FOR CMOS-MEMS THIN FILM ENCAPSULATION

(71) Applicant: Taiwan Semiconductor Manufacturing Company, Ltd., Hsinchu (TW)

(72) Inventors: Yu-Chia Liu, Kaohsiung (TW); Chia-Hua Chu, Zhubei (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/860,357

(22) Filed: Jan. 2, 2018

(65) Prior Publication Data

US 2018/0118560 A1    May 3, 2018

Related U.S. Application Data

(62) Division of application No. 15/066,799, filed on Mar. 10, 2016, now Pat. No. 9,868,628.

(51) Int. Cl.
*B81B 7/00* (2006.01)
*B81C 1/00* (2006.01)

(52) U.S. Cl.
CPC .......... *B81B 7/0006* (2013.01); *B81B 7/0051* (2013.01); *B81C 1/00246* (2013.01); *B81B 2201/0257* (2013.01); *B81B 2201/0264* (2013.01); *B81B 2201/0271* (2013.01); *B81C 2201/0132* (2013.01);
(Continued)

(58) Field of Classification Search
CPC ................ B81B 7/0006; B81B 7/0051; B81B 2201/0257; B81B 2201/0271; B81B 2201/0264; B81C 1/00246; B81C 2203/0735; B81C 2201/0133; B81C 2201/0132; B81C 2201/0176;
(Continued)

(56) References Cited

U.S. PATENT DOCUMENTS 8,897,470 B2 * 11/2014 Huang .................. B81C 1/0023
                                                           381/174
8,945,998 B2   2/2015 Hsu et al.
(Continued)

FOREIGN PATENT DOCUMENTS

CN            101315914 A      12/2008

*Primary Examiner* — Edward Chin
(74) *Attorney, Agent, or Firm* — Slater Matsil, LLP

(57) ABSTRACT

Representative methods for sealing MEMS devices include depositing insulating material over a substrate, forming conductive vias in a first set of layers of the insulating material, and forming metal structures in a second set of layers of the insulating material. The first and second sets of layers are interleaved in alternation. A dummy insulating layer is provided as an upper-most layer of the first set of layers. Portions of the first and second set of layers are etched to form void regions in the insulating material. A conductive pad is formed on and in a top surface of the insulating material. The void regions are sealed with an encapsulating structure. At least a portion of the encapsulating structure is laterally adjacent the dummy insulating layer, and above a top surface of the conductive pad. An etch is performed to remove at least a portion of the dummy insulating layer.

20 Claims, 11 Drawing Sheets

(52) U.S. Cl.
CPC ............... *B81C 2201/0133* (2013.01); *B81C 2201/0176* (2013.01); *B81C 2201/0181* (2013.01); *B81C 2201/112* (2013.01); *B81C 2203/0714* (2013.01); *B81C 2203/0735* (2013.01)

(58) Field of Classification Search
CPC ....... B81C 2201/112; B81C 2203/0714; B81C 2201/0181
See application file for complete search history.

(56) References Cited

U.S. PATENT DOCUMENTS

| | | |
|---|---|---|
| 9,527,721 B2 | 12/2016 | Cheng et al. |
| 9,634,243 B1 | 4/2017 | Chuang et al. |
| 2004/0147056 A1 | 7/2004 | McKinnell et al. |
| 2008/0237823 A1 | 10/2008 | Martin |
| 2012/0038372 A1* | 2/2012 | Reinmuth ........... G01P 15/0802 324/661 |
| 2013/0161702 A1* | 6/2013 | Chen ................... B81C 1/00246 257/254 |
| 2016/0033286 A1 | 2/2016 | Gemelli |
| 2016/0107881 A1 | 4/2016 | Thompson et al. |
| 2016/0332865 A1* | 11/2016 | Chen ................... B81B 3/0054 |
| 2017/0245035 A1* | 8/2017 | Lee ..................... H01L 21/6836 |

\* cited by examiner

METHOD AND STRUCTURE FOR CMOS-MEMS THIN FILM ENCAPSULATION

PRIORITY CLAIM AND CROSS-REFERENCE

This patent application is a divisional of U.S. patent application Ser. No. 15/066,799, filed on Mar. 10, 2016, and entitled "Method and Structure for CMOS-MEMS Thin Film Encapsulation," which application is hereby incorporated by reference herein as if reproduced in its entirety.

BACKGROUND

Advances in integrated circuit (IC) materials and processes have produced ICs with each technological cycle achieving smaller and more complex circuit designs than preceding cycles. In the course of IC development, functional density (i.e., the number of interconnected devices per unit chip area) has generally increased, while discrete size (i.e., the smallest dimensions of individual components that can be manufactured with a given process) has generally decreased.

MEMS devices include structures produced using semiconductor technology to form electrical and mechanical features. MEMS fabrication processes generally involve deposition of thin films of materials on a substrate, application of a patterned mask over the films with photolithographic imaging, and selective etching of the films to the mask. A typical MEMS manufacturing process includes a structured sequence of these operations. MEMS technologies are implemented in a variety of applications, including: accelerometers, acoustic sensors, actuators, gyroscopes, heaters, microfluidic devices, motion sensors, movable mirrors, pressure sensors, printer nozzles, resonators, and RF switches.

BRIEF DESCRIPTION OF THE DRAWINGS

For a more complete understanding of representative embodiments, and advantages thereof, reference is made to the following descriptions taken in conjunction with the accompanying drawings, in which:

FIGS. 1A, 1B, 2A, 2B, and 3-7 are isometric cross-section views illustrating various stages in the manufacture of micro-electromechanical system (MEMS) devices in accordance with representative embodiments, wherein:

FIG. 1A is a cross-sectional side view of a MEMS device at an early stage of fabrication where via features (formed in a plurality of via layers V1-V6) are interleaved with metal features (formed in a plurality of metal layers M1-M6).

FIG. 1B is a cross-sectional top view of a first MEMS device region 180 representatively illustrated in FIG. 1A.

FIG. 2A is a cross-sectional side view of a MEMS fabrication stage after etching to form void regions, in accordance with a representative embodiment.

FIG. 2B is a cross-sectional top view of the first MEMS device region representatively illustrated in FIG. 2A.

FIG. 3 is a cross-sectional side view of a fabrication stage after depositing a sealing material over void regions, in accordance with a representative embodiment.

FIG. 4 is a cross-sectional side view of a fabrication stage after depositing and patterning photoresist over sealing material, in accordance with a representative embodiment.

FIG. 5 is a cross-sectional side view of a fabrication stage after etching to remove exposed portions of sealing material, in accordance with a representative embodiment.

FIG. 6 is a cross-sectional side view of a fabrication stage after etching to remove dummy insulating layer portions, in accordance with a representative embodiment.

FIG. 7 is a cross-sectional side view of a fabrication stage after removal of photoresist, in accordance with a representative embodiment.

Figure 1A:
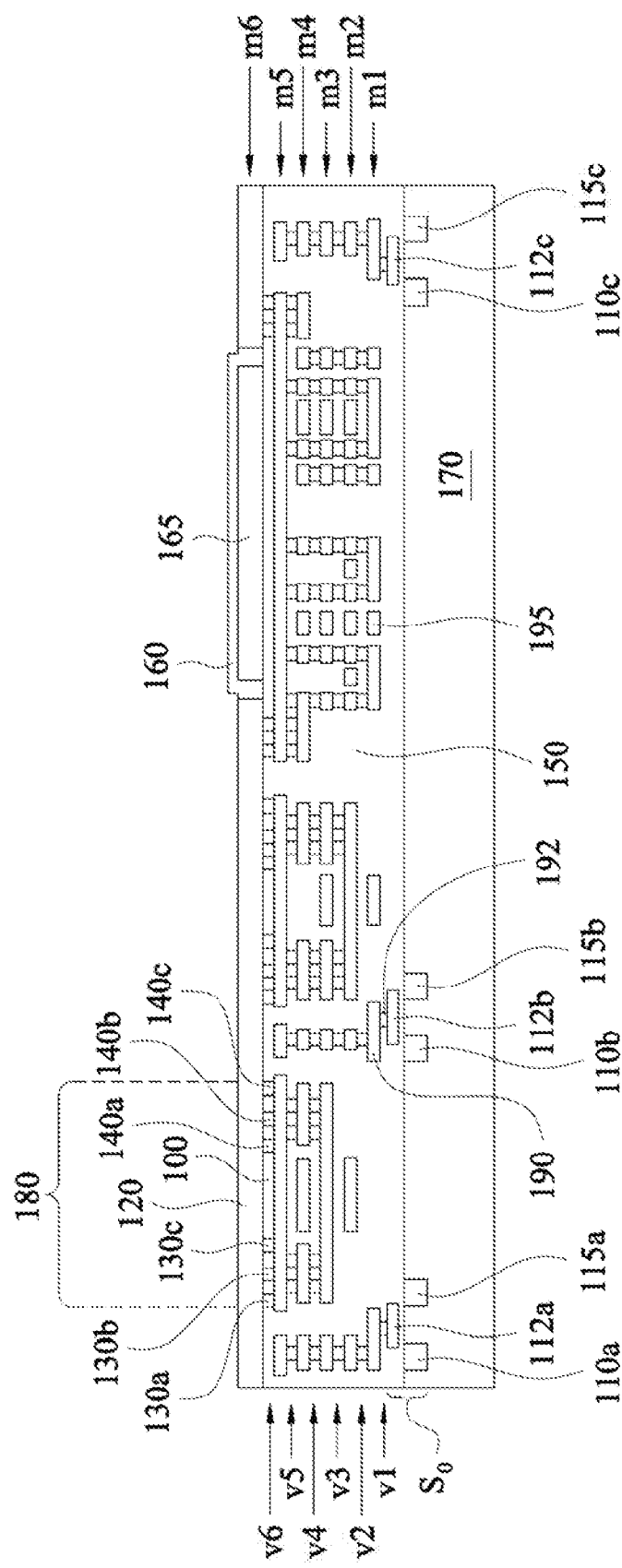

The drawings accompanying and forming part of this specification are included to representatively illustrate certain aspects of the disclosure. It is noted that features illustrated in the drawings are not necessarily drawn to scale.

DETAILED DESCRIPTION OF ILLUSTRATIVE EMBODIMENTS

The following disclosure describes various embodiments and representative examples. Specific examples of components and arrangements of components are discussed below to simplify the description. These are merely examples and are not intended to limit the disclosure. For example, the formation of a first feature "over" or "on" a second feature may include embodiments in which the first and second features are formed, e.g., in direct contact, and may also include embodiments in which additional features may be formed, e.g., between the first and second features, such that the first and second features may not be in direct contact. The present disclosure may repeat reference numerals and/or letters in various examples. Such repetition is for the purpose of simplicity and clarity, and does not in itself dictate a relationship between the various embodiments and/or configurations described.

Conventional approaches for sealing micro-electromechanical system (MEMS) devices typically involve depositing sealant material directly on a surface of a MEMS device to seal void regions of the device, usually under vacuum. Depending on the sealing material used, this can cause deleterious stress on underlying device elements. This stress can be a result of lattice mismatch at a contact interface between the sealing material and dielectric material of the MEMS device. Stress may also be induced from a difference in thermal expansion coefficients when sealing material and dielectric material are brought into contact with each other and subsequently heated or cooled.

Membrane-based MEMS sensor elements are particularly vulnerable to stress. For example, in the case of MEMS-based pressure sensors, acoustic sensors, or the like, stress resulting from sealing material being directly deposited on MEMS device structures may prevent a membrane element from achieving an intended mode of operation, or otherwise impair the membrane from movement in one or more vibrational or translational degrees of freedom.

In order to prepare a finished MEMS device for electrical testing, portions of sealing material are removed. If a dry etch is used to remove sealing material in accordance with conventional approaches, an asymmetric layer may result. In this context, an asymmetric configuration may be understood as corresponding to some of the MEMS devices having overlying insulating material exposed to the operating environment while other MEMS devices have overlying metal portions exposed to the operating environment.

If a symmetric layer is desired, conventional techniques generally require an additional mask to protect overlying dielectric layers from etching; thereby increasing costs associated with performing additional processes to provide the protective mask. Consequently, symmetric layers are not easily or inexpensively implemented for conventionally manufactured complementary metal oxide semiconductor (CMOS) MEMS devices where sealing material and dielectric material are removed substantially simultaneously. Additionally, conventional methods for removing sealing material from regions of a MEMS device can produce excess residue—also deleteriously affecting MEMS device performance. Accordingly, conventional approaches for sealing CMOS-MEMS devices have been associated with poor sensor sensitivity, reduced signal-to-noise ratio (SNR), and increased total harmonic distortion (THD).

Embodiments described herein generally provide thin-film MEMS encapsulation methods and structures with improved device performance and lower manufacturing cost. FIG. 1A representatively illustrates a cross-sectional side view of a MEMS device at an early stage of fabrication. Transistor structures 110a/112a/115a, 110b/112b/115b, and 110c/112c/115c may be formed in a layer $s_0$ corresponding to an interface region between substrate 170 and insulating layer 150. Source/drain (S/D) regions 110a/115a, 110b/115b, and 110c/115c may be formed in substrate 170 by ion-implantation with p-type or n-type dopants. Insulating material of insulating layer 150 may be deposited over substrate 170. Insulating material may be deposited using any suitable method, such as, atomic layer deposition (ALD), chemical vapor deposition (CVD), HDP-CVD, physical vapor deposition (PVD), and/or the like. Transistor gate structures 112a, 112b, 112c may be formed in the insulating material. Processes for forming CMOS transistor devices are known, and will not be described in detail herein for brevity and clarity of description.

Substrate 170 may comprise any type of semiconductor material, such as an elementary semiconductor material; e.g., silicon, germanium, or the like. In some embodiments, substrate 170 may comprise a compound semiconductor, such as silicon carbide, gallium arsenide, gallium phosphide, indium phosphide, indium arsenide, and/or the like, or combinations thereof. In other embodiments, substrate 170 may comprise an alloy semiconductor, such as SiGe, or GaAsP, and/or the like, or combinations thereof. Insulating material may comprise, e.g., silicon oxide, silicon nitride, low-k dielectrics such as carbon doped oxides, extremely low-k dielectrics such as porous carbon doped silicon dioxide, a polymer such as polyimide, and/or any other suitable dielectric or insulating compound, or combinations thereof. Transistor gate structures 112a, 112b, 112c may comprise, e.g., polysilicon or other suitable materials.

Via layers V1-V6 and metal layers M1-M6 may be formed by sequentially depositing insulating material over substrate 170, patterning the insulating material using lithography and etching to form openings therein, and filling the openings with conductive material to form alternating layers of via features and metal features. In accordance with a representative embodiment, a first via layer V1 may be formed over transistor gate structures 112a, 112b, 112c such that each gate structure is in physical contact with, or otherwise electrically coupled to, a conductive via. Thereafter, another layer of insulating material may be deposited over the first via layer V1 and patterned, etched, and filled to form metal features therein. Representative metal features may comprise lines, wires, pads, membranes, or the like. In accordance with a representative aspect, metal features so formed may be suitably configured to be in contact with, or otherwise electrically coupled to, one or more immediately underlying conductive vias; e.g., metal feature 190 in contact with underlying via feature 192. In accordance with another representative aspect, metal features may be suitably configured not to be in contact with, or otherwise not electrically coupled to, underlying conductive vias; e.g., metal feature 195 not in contact with underlying via features. Vias of via layers V1-V6 may comprise a metal (e.g., tungsten), a metal alloy (e.g., CuW), an electrically conductive compound, and/or the like, or combinations thereof. Metal features of metal layers M1-M6 may comprise a metal (e.g., copper), a metal alloy (e.g., AlCu), an electrically conductive compound, and/or the like, or combinations thereof.

In a representative embodiment, the above-described process may be iteratively performed to produce a series of via layers V1, V2, V3, V4, V5, V6 and a series of metal layers M1, M2, M3, M4, M5, M6 interleaved with each other; e.g., in order, from bottom to top: V1, M1, V2, M2, V3, M3, V4, M4, V5, M5, V6, M6. Optionally, a portion of material 120 forming the upper-most metal layer M6 may comprise a metal cap 165. Metal cap 165 may be suitably configured to provide mechanical strength or stiffness to a region of a MEMS device that would otherwise not meet quality, performance, or other device specifications if metal cap 165 were otherwise absent. Metal cap 165 may comprise a relatively thick (e.g., about 20 kÅ to about 40 kÅ) deposition of material. Metal cap 165 may be formed with known processes (e.g., lithographic imaging, masking, etching, and/or the like) that are not described in detail herein for concision and clarity. A passivation layer 160 may be formed over metal cap 165 to protect metal cap 165 during subsequent processing. Methods for forming passivation layers are known, and also are not described in detail herein for brevity and clarity of description.

Insulating layer 150 may be formed by sequential stacking of insulating material deposited during successive fabrication of alternating via layers V1-V6 and metal layers M1-M6. Notwithstanding sequential build-up of insulating material to form discrete via and metal layers, the nomenclature "insulating layer" will generally be understood as referring to an accumulated deposition of one or more insulating material layers to form a substantially unitary layer (e.g., "insulating layer 150") for purposes of describing various embodiments and features herein.

Figure 1B:
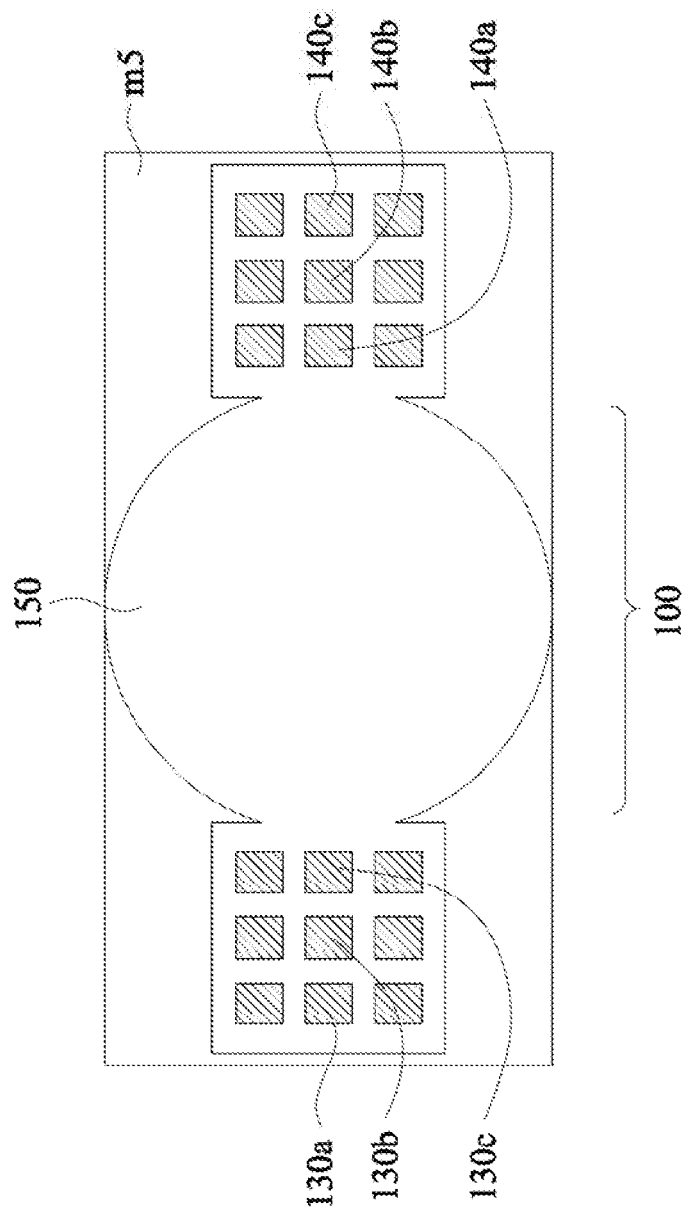

FIG. 1B illustrates a cross-sectional top view of a MEMS device at an interface between upper-most via layer V6 and underlying metal layer M5, in accordance with an embodiment for a first MEMS device region 180 representatively illustrated in FIG. 1A. Via features 130a, 130b, 130c, 140a, 140b, 140c are disposed within insulating layer 150. Dummy insulation feature 100 comprises a portion of insulating layer 150 disposed at layer V6 between via features 130c and 140a. As representatively illustrated, layer V6 may be variously regarded as an upper-most via layer, a dummy insulation layer, a dummy dielectric layer, or a dummy oxide layer.

Figure 2A:
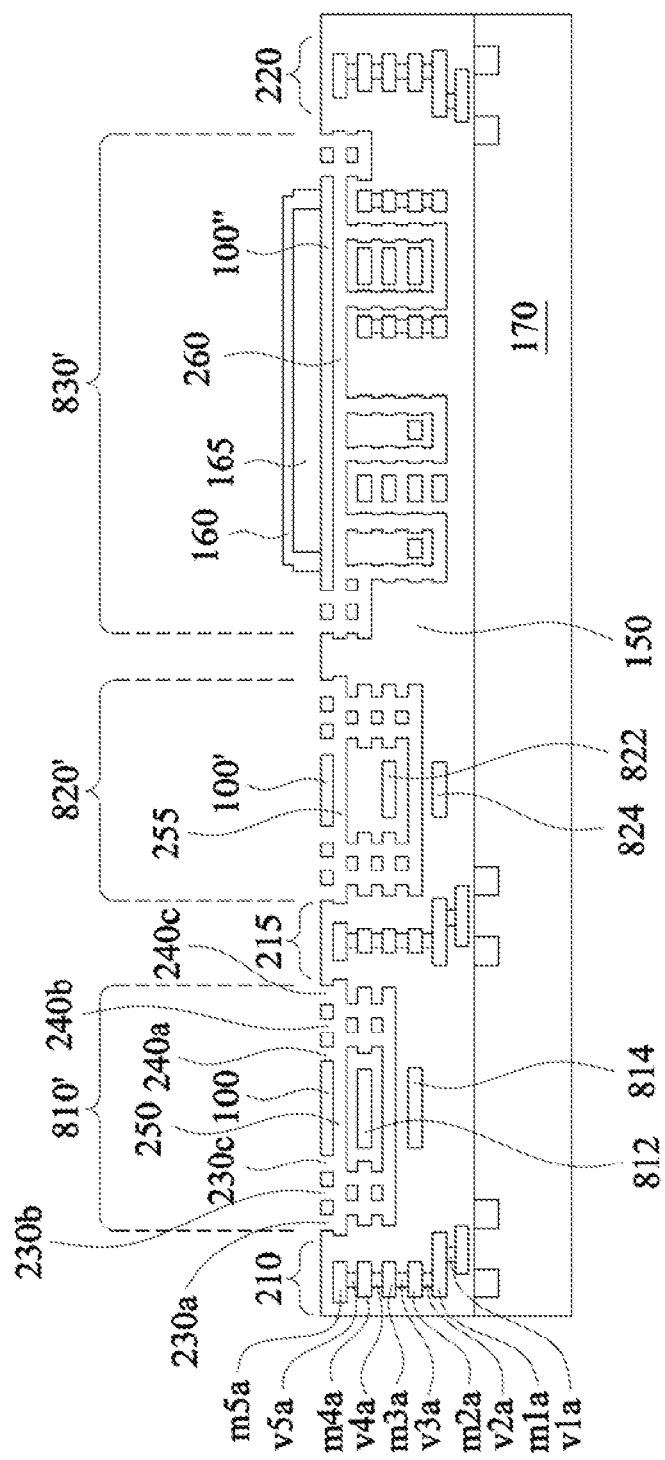

As representatively illustrated in FIG. 2A, a maskless wet etching may be performed to remove metal features and via features that are successively exposed to produce void regions 810', 820', 830'. In an embodiment, a wet etch may be performed with sulfuric acid and peroxide, although other suitable etch chemistries may be alternatively or conjunctively used. Etch chemistries for removing via and metal feature materials are known, and will not be described in detail herein for brevity and clarity of description.

Wet etching removes metal features not protected by overlying material of insulating layer 150 or passivation layer 160, as representatively illustrated in FIG. 1A. For example, interconnect regions 210, 215, 220 are configured with overlying insulating material at V6, and are accordingly not exposed to etching chemistry. In a representative embodiment, the etch chemistry initially etches and penetrates exposed metal layer M6, then proceeds to underlying via layer V6 (removing via features 130a, 130b, 130c, 140a, 140b, 140c to produce corresponding via openings 230a, 230b, 230c, 240a, 240b, 240c). Thereafter, underlying metal layer M5 is etched (e.g., forming void region portions 250, 255, 260). Thereafter, underlying via layer V5 is etched, and so forth, until void regions 810', 820', 830' have been substantially formed. In a representative embodiment, void region 810' corresponds to a first MEMS device region, void region 820' corresponds to a second MEMS device region, and void region 830' corresponds to a third MEMS device region.

Figure 8:
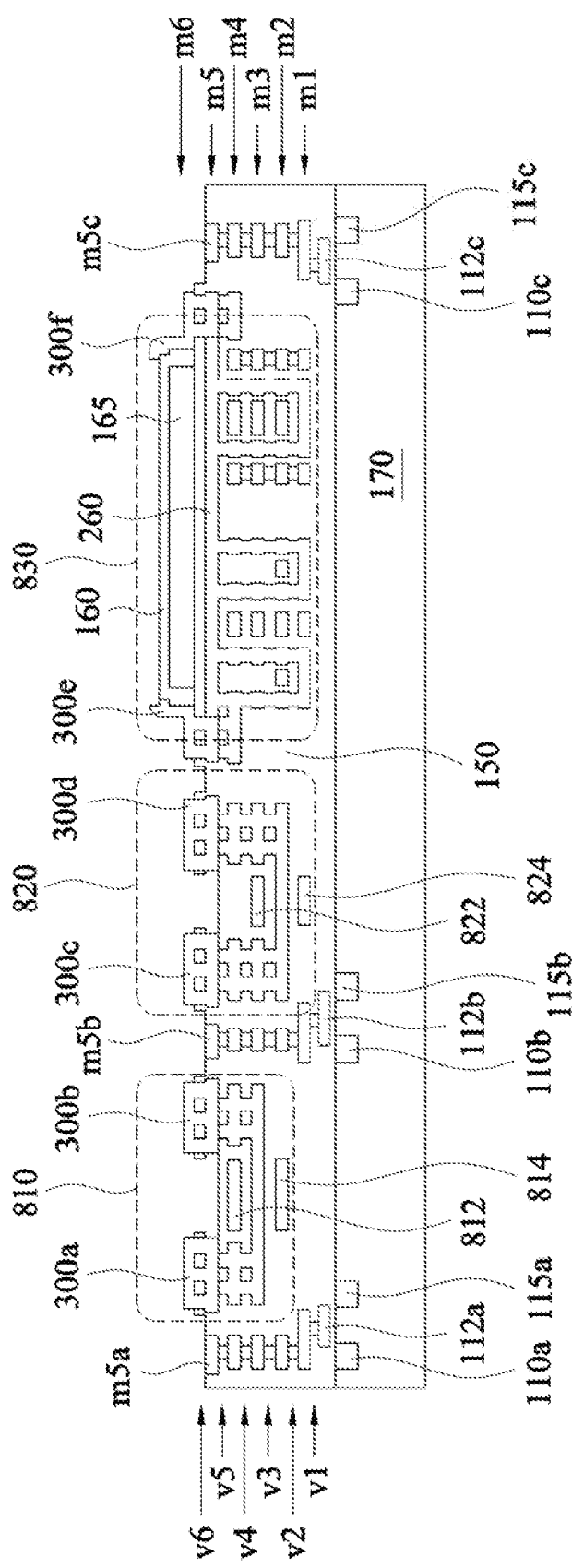
FIG. 8 is a cross-sectional side view illustrating discrete MEMS devices (e.g., a first MEMS device 810, a second MEMS device 820, and a third MEMS device 830) formed in accordance with a representative embodiment.

Etching leaves dummy insulation features 100, 100' and insulation feature 100" of insulating layer 150 remaining over void region portions 250, 255, 260. In a representative embodiment, etching also leaves other underlying metal features remaining that comprise components of MEMS devices. For example, active membrane 812 and reference membrane 814 may comprise device features of a MEMS pressure sensor (FIG. 8, first MEMS device 810), and active membrane 822 and reference membrane 824 may comprise device features of a MEMS acoustic sensor (FIG. 8, second MEMS device 820).

In some embodiments, a second MEMS device 820 may be configured to operate as a microphone for converting sound impulses into electrical signals, although other applications are also possible. During microphone operation, sound in the form of a time-varying pressure wave may interact with active membrane 822 by causing vibrational or translational displacement of active membrane 822 relative to reference membrane 824. To convert the displacements into electrical signals, a CMOS circuit (not shown) measures the capacitance between active membrane 822 and reference membrane 824. For example, the CMOS circuit may supply a predetermined charge to active membrane 822 and reference membrane 824, and monitor a voltage change between active membrane 822 and reference membrane 824 as a function of charge. By polling current and voltage measurements over time, the CMOS circuit may be suitably configured to calculate perturbations in capacitance in accordance with the following:

$$I(t) = \frac{d}{dt}CV(t)$$

. . . where time-varying current I(t) is expressed as a time-rated change of the product of capacitance C and time-varying voltage V(t). Because capacitance reflects the distance between active membrane 822 and reference membrane 824, and this distance changes over time in correspondence to impinging sound, the CMOS circuit can provide an electrical signal representative of sound impinging on active membrane 822. It will be appreciated that substantially similar structures may be employed to produce a variety of other types of MEMS devices; e.g., an active membrane 812 and a reference membrane 814 may be suitably configured or otherwise adapted to provide similar functionality for a MEMS pressure sensor (FIG. 8, first MEMS device 810).

In a representative embodiment, interconnect region 210 comprises a set of metal features in metal layers M1-M5 and a set via features in via layers V1-V5. Via feature via is coupled to metal feature m1a, which is coupled to via feature v2a, which is coupled to metal feature m2a, and so on. In an embodiment, the composite structure of v1a, m1a, v2a, m2a, v3a, m3a, v4a, m4a, v5a, and m5a comprises an interconnect for a MEMS device (FIG. 8, first MEMS device 810). Via features v1a, v2a, v3a, v4a, v5a are interleaved in alternation with metal features m1a, m2a, m3a, m4a, m5a. Similar interconnect structures are illustrated in interconnect region 215 for another MEMS device (FIG. 8, second MEMS device 820) and in interconnect region 220 for yet another MEMS device (FIG. 8, third MEMS device 830).

Figure 2B:
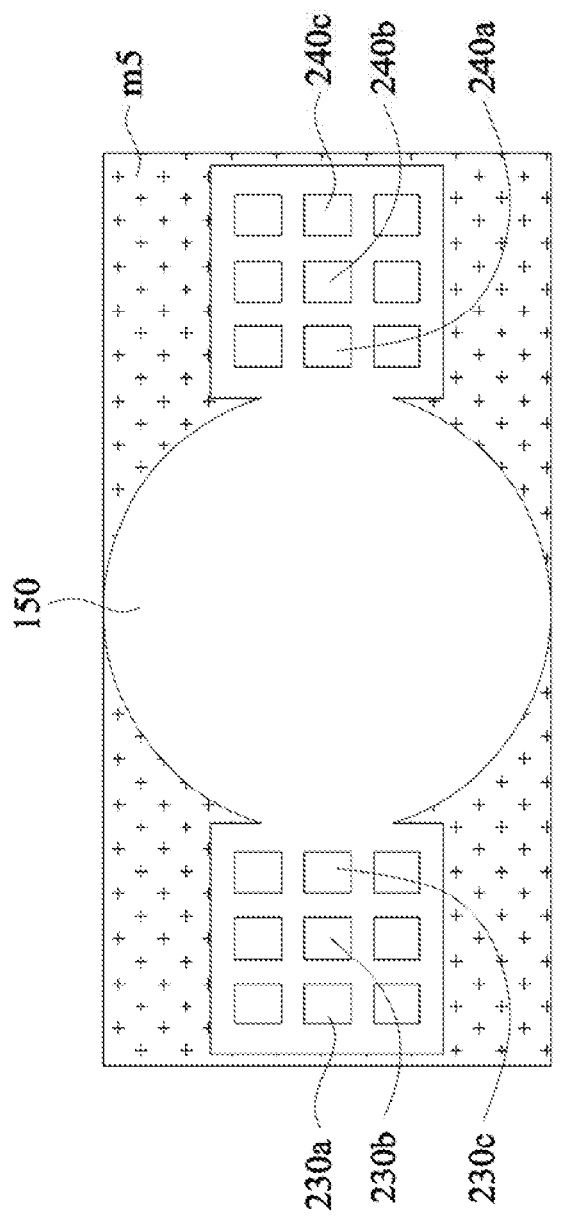

FIG. 2B illustrates a cross-sectional top view of a MEMS device at an interface between upper-most via layer V6 and underlying metal layer M5, in accordance with an embodiment for a first MEMS device region (FIG. 1A, first MEMS device region 180) representatively illustrated in FIG. 2A, after etching to produce void regions 810', 820', 830'.

Figure 3:
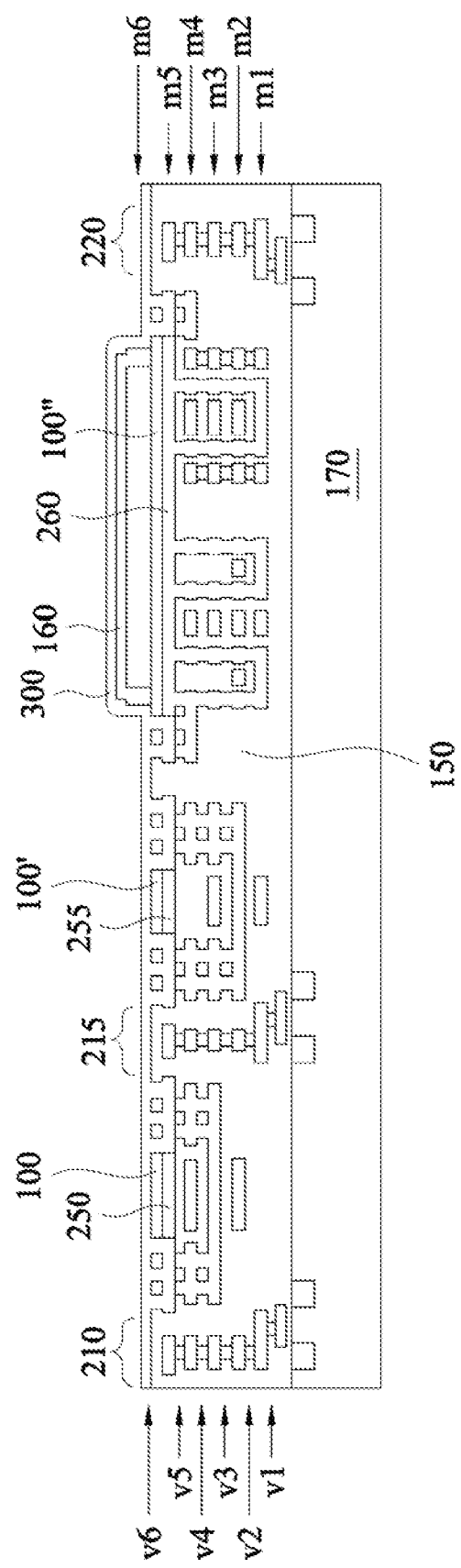

As representatively illustrated in FIG. 3, sealing material 300 is deposited over top surfaces of void regions 810', 820', 830' and laterally adjacent portions there between. Sealing material 300 may be deposited using any suitable process, such as, ALD, CVD, HDP-CVD, PVD, spin-on coating (e.g., for polymers), and/or the like. Sealing material 300 may comprise AlCu, titanium, titanium nitride, silicon nitride, silane oxide, polymer materials, polydimethylsiloxane, poly(p-xylylene) polymers (e.g., parylene-C), and/or any other suitable compounds, or combinations thereof. In a representative embodiment, sealing material 300 may be deposited with a thickness of between about 2 kÅ and 4 kÅ to seal one or more cavities of one or more MEMS devices.

Figure 5:
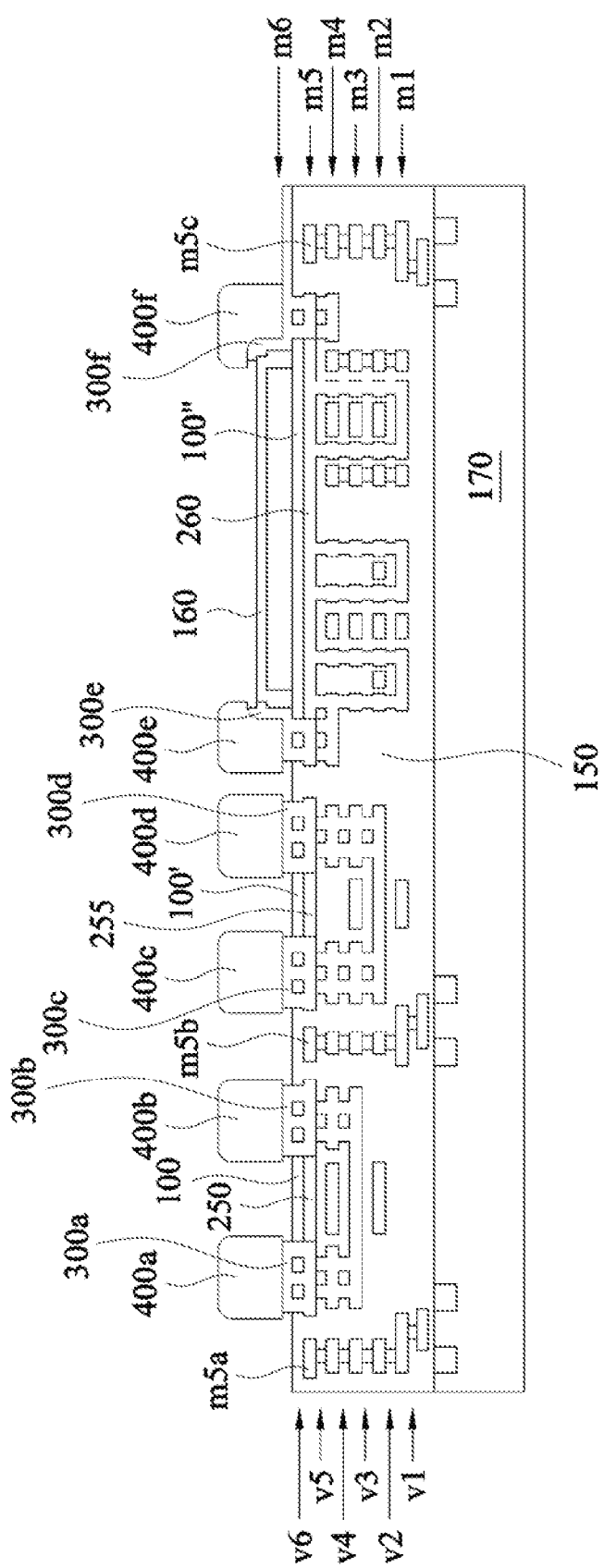

In an embodiment, sealing material 300 may be disposed over insulating layer 150 and in via openings 230a, 230b, 230c, 240a, 240b, 240c of first void region 810' to form sealing structures 300a, 300b (see FIG. 5). Sealing material 300 may also be disposed in corresponding via layer V6 openings of second void region 820' and third void region 830' to form sealing structures 300c, 300d, 300e, 300f (see FIG. 5). Sealing material 300 may also be disposed in metal layer portions of M5 substantially underlying via layer V6 openings. Sealing material 300 may also be disposed above, over, or on passivation layer 160. Sealing material may be disposed over interconnect regions 210, 215, 220. Sealing material 300 may comprise a substantially contiguous layer disposed over or above a plurality of via features in a plurality of via layers V1-V5. Sealing material 300 may comprise a substantially contiguous layer disposed above or over a plurality of metal features in a plurality of metal layers M1-M6. Sealing material 300 may comprise a substantially continuous layer of material that is at least partially disposed in void region portions of one or more via layers (e.g., V6). Sealing material 300 may comprise a substantially uninterrupted layer of material that is disposed in void region portions of one or more metal layers (e.g., M5 and M6).

In accordance with a representative embodiment, sealing material 300 may be deposited in substantially direct physical contact with dummy insulation features 100, 100'. It will be appreciated that other embodiments may employ additional material layers above or below dummy insulation features 100, 100'. To the extent that such additional material layers perform substantially the same function (e.g., are at least partially disposable), achieve substantially the same result (e.g., prevent or otherwise lessen stress induced on or in one or more MEMS device structures), or are intended for similar initial disposition (e.g., disposed above one or more MEMS device structures) and subsequent disposition (e.g., at least partially removed from being above one or more MEMS device structures), such additional material layers will be understood as being equivalent to or otherwise finding correspondence with a "dummy insulation" feature (even if such additional material layers do not comprise insulating material), or a "dummy dielectric" feature (even where such additional material layers do not comprise dielectric material), or a "dummy oxide" feature (even where such additional material layers do not comprise oxide material).

As will be described later with reference to further processing, sealing material 300 does not physically contact a subsequently exposed MEMS device surface. Accordingly, there will be no stress induced attendant to sealing material 300 being directly deposited on MEMS device surfaces themselves; rather, sealing material 300 is deposited on dummy insulation features 100, 100', which are removed at a later stage of MEMS device fabrication. In a representative embodiment, the combination of dummy insulating features 100, 100' and void region portions 250, 255 disposed in immediately underlying metal layer M5 are configured to prevent or otherwise lessen stress induced on or in one or more underlying MEMS device structures, elements, components, or features. Void region portions 250, 255 may correspond to a gap region between dummy insulating features 100, 100' and underlying MEMS device surfaces that are exposed in subsequent processing. Accordingly, void region portions 250, 255 may be suitably configured to provide further protection from stress being induced in or otherwise imparted to subsequently exposed MEMS device surfaces.

Sealing material 300 seals, encapsulates, closes off, or otherwise forms a substantially non-permeable barrier between void regions 810', 820', 830' and an external environment. In representative embodiments, void regions 810', 820', 830' may be exposed to vacuum to at least partially remove ambient gas from void regions 810', 820', 830' prior to sealing or encapsulation with sealing material 300. In another representative embodiment, void regions 810', 820', 830' may be purged with a gas (e.g., an inert gas, such as dry nitrogen) prior to sealing or encapsulation with sealing material 300. In yet another representative embodiment, void regions 810', 820', 830' may be sealed without pulling vacuum or gas purging. Processes for preparing MEMS device cavities are known, and will not be described in detail herein for brevity and clarity of description.

Figure 4:
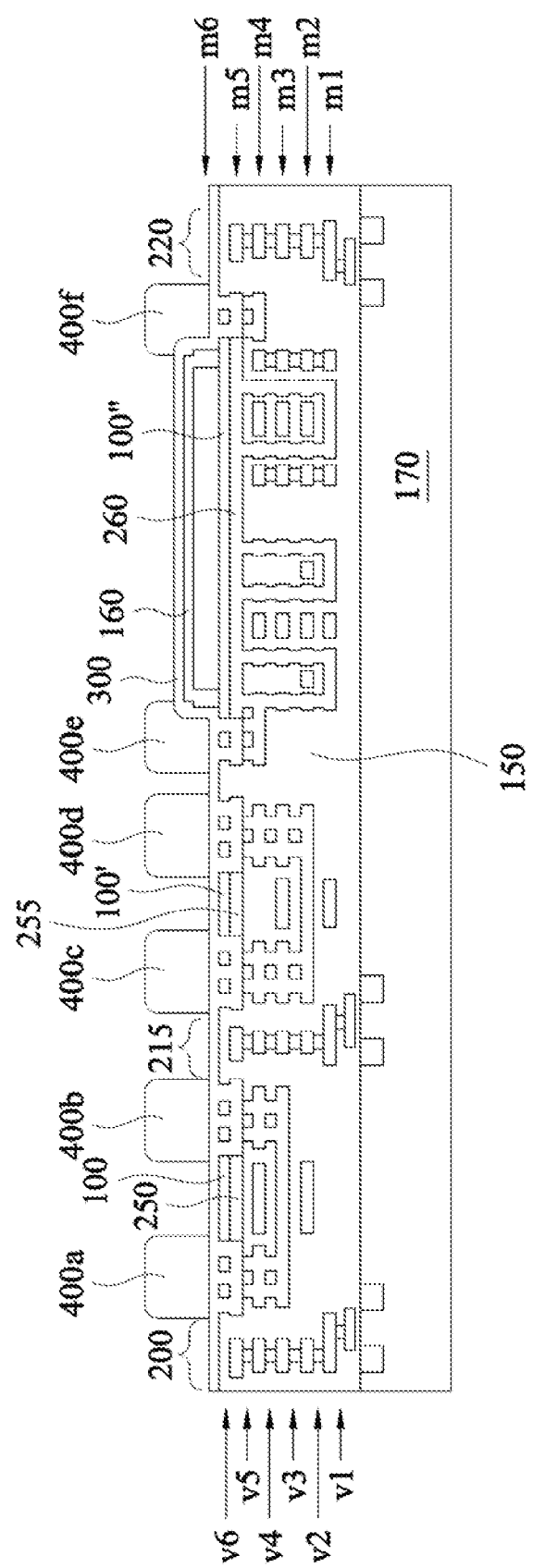

As representatively illustrated in FIG. 4, a photoresist layer may be deposited and patterned after deposition of sealing material 300. In an embodiment, patterned photoresist 400a, 400b, 400c, 400d, 400e, 400f provides protection for portions (FIG. 5, sealing structures 300a, 300b, 300c, 300d, 300e, 300f) of sealing material 300 that seal, encapsulate, or close off void regions 810', 820', 830'. In a representatively beneficial aspect, a single mask may be used to form patterned photoresist 400a, 400b, 400c, 400d, 400e, 400f. Processes for depositing and patterning photoresist are known, and will not be described in detail herein for brevity and clarity of description.

As representatively illustrated in FIG. 5, an etch may be performed to remove portions of sealing material 300 not covered by patterned photoresist 400a, 400b, 400c, 400d, 400e, 400f to expose underlying dummy insulation features 100, 100' and passivation layer 160 for subsequent processing. Removal of unprotected portions of sealing material 300 also exposes material of insulating layer 150 overlying contact pads m5a, m5b, m5c for subsequent processing. Removal of unprotected sealing material 300 portions forms discrete sealing structures 300a, 300b (sealing void region 810'), sealing structures 300c, 300d (sealing void region 820'), and sealing structures 300e, 300d (sealing void region 830'). In accordance with representative embodiments, an etch to remove portions of sealing material 300 may comprise a dry etch or a wet etch. Etching processes for removing sealant materials are known, and will not be described in detail herein for brevity and clarity of description.

Figure 6:
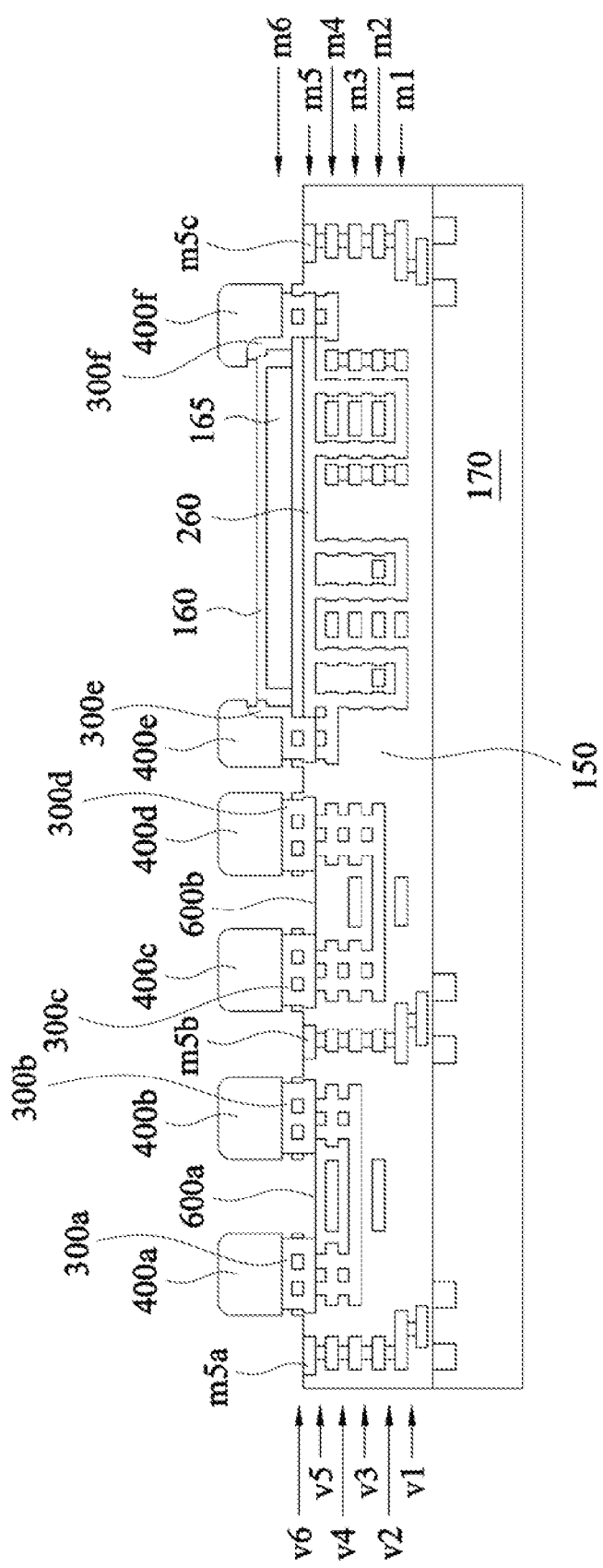
Figure 7:
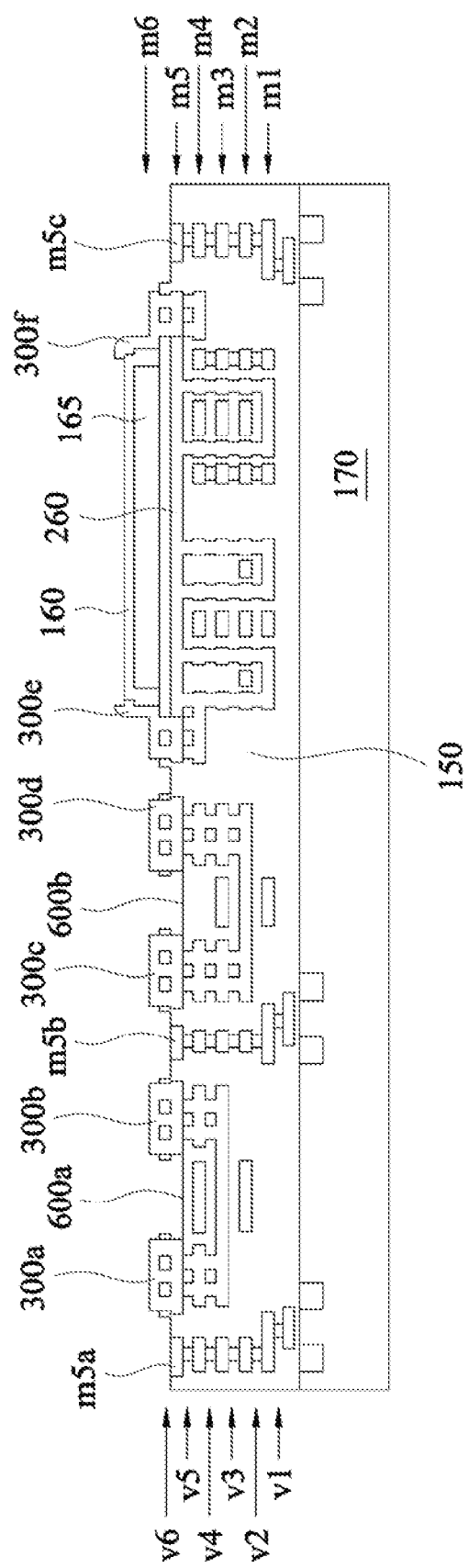

As representatively illustrated in FIG. 6, material of insulating layer 150 corresponding to dummy insulation features 100, 100', and other exposed portions of insulating layer 150 at V6, are removed with etching. In accordance with a representative embodiment where insulating layer 150 comprises $SiO_2$, a reactive ion etch (RIE) may be performed to remove at least substantial portions of dummy insulation features 100, 100'. At least partial removal of dummy insulation features 100, 100' exposes sensing membrane 600a of, e.g., a pressure sensor (FIG. 8, first MEMS device 810), and sensing membrane 600b of, e.g., an acoustic sensor (FIG. 8, second MEMS device 820). At least partial removal of exposed insulating layer 150 at V6 in interconnect regions 210, 215, 220 exposes top surfaces of contact pads m5a, m5b, m5c for subsequent MEMS device testing. Sealing structures 300a, 300b, 300c, 300d, 300e, 300f have portions that are disposed above top surfaces of contact pads m5a, m5b, m5c. Metal cap 165 remains, owing to etch protection afforded by passivation layer 160. Thereafter, as representatively illustrated in FIG. 7, patterned photoresist 400a, 400b, 400c, 400d, 400e, 400f may be removed.

As representatively illustrated in FIG. 8, a MEMS device comprises a plurality of vias in a plurality of via layers (V1-V6) and a plurality of metal features in a plurality of metal layers (M1-M6). The plurality of via layers (V1-V6) are interleaved in alternation with the plurality of metal layers (M1-M6). The plurality of via layers (V1-V6) and the plurality of metal layers (M1-M6) are disposed in an insulating layer 150. Void regions are disposed in the insulating layer 150. Contact pads m5a, m5b, m5c are disposed in the insulating layer 150 at a top surface of the insulating layer 150. Sealing structures 300a, 300b, 300c, 300d, 300e, 300f are over the void regions. The sealing structures 300a, 300b, 300c, 300d, 300e, 300f substantially seal the void regions. At least a portion of each sealing structure 300a, 300b, 300c, 300d, 300e, 300f is disposed above top surfaces of contact pads m5a, m5b, m5c.

A first MEMS device 810 (e.g., corresponding to a MEMS pressure sensor) comprises an active membrane 812 separated from a reference membrane 814 by a portion of void region 810' sealed with sealing structures 300a, 300b. Active membrane 812 and reference membrane 814 are electrically coupled to a first interconnect structure underlying and in connection with contact pad m5a. The first interconnect structure couples contact pad m5a with the gate structure 112a of an underlying first transistor device 110a/112a/115a. The gate structure 112a of the first transistor device comprises polysilicon disposed in a bottom portion of insulating layer 150. The S/D regions 110a, 115a of the first transistor device comprise ion implantation regions disposed in substrate 170.

A second MEMS device 820 (e.g., corresponding to a MEMS acoustic sensor) comprises an active membrane 822 separated from a reference membrane 824 by a portion of void region 820' sealed with sealing structures 300c, 300d. Active membrane 822 and reference membrane 824 are electrically coupled to a second interconnect structure underlying and in connection with contact pad m5b. The second interconnect structure couples contact pad m5b with the gate structure 112b of an underlying second transistor device 110b/112b/115b. The gate structure 112b of the second transistor device comprises polysilicon disposed in a bottom portion of insulating layer 150. The S/D regions 110b, 115b of the second transistor device comprise implantation regions disposed in substrate 170.

A third MEMS device 830 (e.g., corresponding to a MEMS thermal conductivity gauge and resonator) comprises a metal cap 165 overlying via features and metal features disposed in insulating layer 150. Metal cap 165 provides mechanical support over a lateral region of third MEMS device 830. Void region 830' is sealed with sealing structures 300e, 300f. Passivation layer 160 is over and on metal cap 165. Via and/or metal features of third MEMS device 830 are coupled to a third interconnect structure underlying and in connection with contact pad m5c. The third interconnect structure couples contact pad m5c with the gate structure 112c of an underlying third transistor device 110c/112c/115c. The gate structure 112c of the third transistor device comprises polysilicon disposed in a bottom portion of insulating layer 150. S/D regions 110c, 115c of the third transistor device are implanted in substrate 170.

Figure 9:
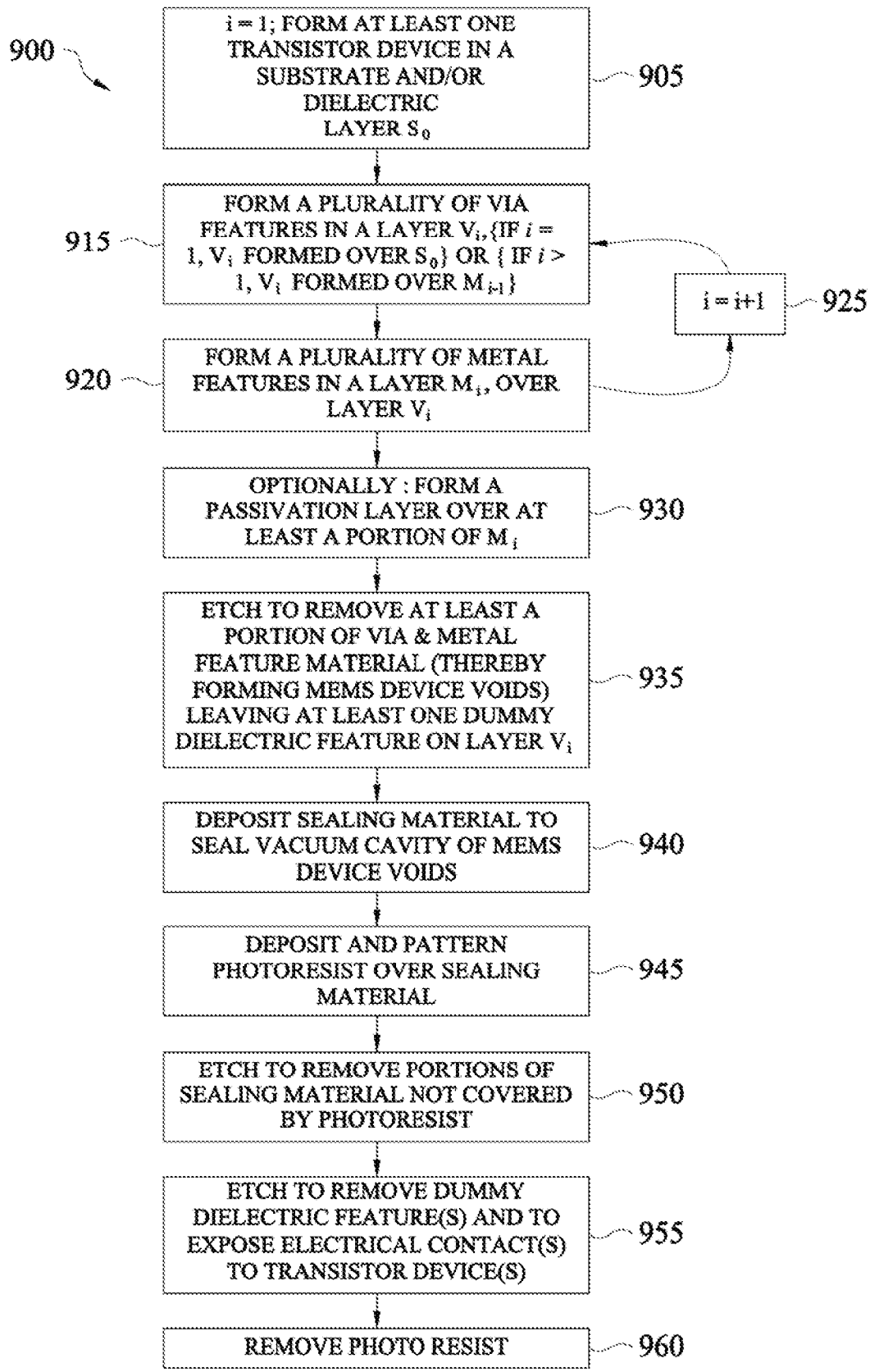
FIG. 9 is a flowchart of a method for manufacturing and sealing void regions of a MEMS device in accordance with a representative embodiment.

FIG. 9 representatively illustrates a MEMS device fabrication method 900 in accordance with a representative embodiment. Fabrication method 900 begins with a step 905 of initializing a layer-count index variable i to one (i=1), and forming a transistor device in a substrate and/or dielectric layer $s_0$ (e.g., FIG. 1A, transistor device 110a/112a/115a formed in layer $s_0$ comprising an interface region between substrate 170 and insulating layer 150). In a next step 915, a plurality of via features are formed in a via layer $V_i$. For i=1, the $V_1$ layer is formed over layer $s_0$. Layer $V_1$ is formed by depositing dielectric material over layer $s_0$ and patterning the dielectric material with lithographic imaging, etching, and fill to form via features therein. In a next step 920, metal features are formed in a metal layer $M_i$. For i=1, the $M_1$ layer is formed over the $V_1$ layer. Layer $M_1$ is formed by depositing dielectric material over layer $V_1$ and patterning the dielectric material with lithographic imaging, etching, and fill to form metal features therein. In a next step 925, layer-count index i is incremented (i=i+1). In a next step 915 (second sweep), another plurality of via features are formed in a via layer $V_i$. For i=2, the $V_2$ layer is formed on the $M_1$ layer ($M_{i-1}$). Layer $V_2$ is formed by depositing dielectric material over layer $M_1$ and patterning the dielectric material with lithographic imaging, etching, and fill to form via features therein. In a next step 920 (second sweep), another set of metal features are formed in a metal layer $M_i$. For i=2, the $M_2$ layer is formed over the $V_2$ layer. Layer $M_2$ is formed by depositing dielectric material over layer $V_2$ and patterning the dielectric material with lithographic imaging, etching, and fill to form via features therein. Steps 925, 915, and 920 may be iterated to build up a plurality of via layers $V_1$-$V_i$ and a plurality of metal layers $M_1$-$M_i$. In a representative embodiment, there may be six (i=6) via layers ($V_1$-$V_6$) and metal layers ($M_1$-$M_6$). After the via and metal layers have been formed, in an optional next step 930, a passivation layer may be formed on or over at least a portion of metal layer $M_6$ ($M_i$). In a next step 935, portions of via and metal feature material may be removed with etching to form MEMS device void regions, with at least a portion of the dielectric material on the upper-most via layer $V_i$ remaining as a dummy dielectric layer. In a next step 940, a sealing material may be deposited to seal the MEMS device void regions under vacuum. In a next step 945, photoresist may be deposited over the sealing material and patterned to provide protection for underlying portions of sealing material during subsequent etching. In a next step 950, a first etch may be performed to remove portions of sealing material not protected by overlying photoresist. In the next step 955, a second etch may be performed to remove dummy dielectric layer portions and to expose electrical contacts to underlying transistor devices. In a next step 960, photoresist is removed.

In accordance with a representative embodiment where insulating layer 150 comprises an oxide material, an existing oxide layer may be used as a dummy layer to prevent or otherwise reduce stress from being induced on or in a MEMS device. The dummy layer provides a symmetric structure for MEMS devices with regard to disposition of overlying oxide material after removal of dummy layer portions. For example, substantially all MEMS devices so formed will have an oxide layer portion overlying a highest-lying MEMS device metal feature (e.g., active membranes 812, 822). The dummy layer can also prevent or otherwise reduce defects associated with residue that would otherwise be formed when sealing material is directly deposited on a MEMS device surface. Additionally, forming the dummy layer with oxide material of the MEMS device structure allows standard CMOS and CMOS-compatible processes to be used without the need for an additional mask to protect overlying oxide layers.

In accordance with a representative embodiment, a method for manufacturing a MEMS device includes: depositing an insulating layer over a substrate; forming a plurality of conductive vias in a plurality of first layers of the insulating layer; forming a plurality of metal structures in a plurality of second layers of the insulating layer, the plurality of first layers interleaved or otherwise alternating with the plurality of second layers; etching a first set of one or more of the plurality of conductive vias and a second set of one or more of the plurality of metal structures to form a void region in the insulating layer; forming a conductive pad on, and within a top surface of the insulating layer; and sealing the void region with an encapsulating structure, with at least a portion of the encapsulating structure being disposed above a top surface of the conductive pad. A transistor structure may be formed below the plurality of first layers and the plurality of second layers. A conductive interconnect structure may be formed between a top surface of a gate of the transistor structure and a bottom surface of the conductive pad, the conductive interconnect structure comprising a first set of the plurality of metal structures and a second set of the plurality of conductive vias. At least a portion of the transistor structure may be formed in the substrate. A passivation layer may be formed over or above at least one of the plurality of metal structures.

In accordance with another representative embodiment, a method for manufacturing a CMOS-MEMS device includes: depositing a dielectric layer over a substrate; forming a transistor device in at least one of the substrate and the dielectric layer; forming a plurality of via layers in the dielectric layer, the plurality of via layers comprising a plurality of via structures; forming a plurality of metal layers in the dielectric layer, the plurality of metal layers comprising a plurality of metal structures, the plurality of metal layers alternating with the plurality of via layers; etching to remove at least a portion of via structure material and at least a portion of metal structure material to form a void region; depositing a sealant material over the void region; depositing a photoresist over the sealant material; patterning the photoresist to expose a portion of the sealant material; performing a first etch to remove exposed portions of the sealant material; and performing a second etch to remove at least a portion of a dummy dielectric layer adjacent a remaining portion of sealant material. The method may also include removing the photoresist. The dummy dielectric layer may comprise an upper-most via layer of the plurality of via layers. A passivation layer may be formed over an upper-most metal layer of the plurality of metal layers. A conductive pad may be formed on and within a top surface of the dielectric layer. An interconnect structure may be formed between a top surface of a gate of the transistor device and a bottom surface of the conductive pad, the interconnect structure comprising a first set of the plurality of metal structures interleaved with a second set of the plurality of via structures. The first etch and the second etch may be the same etch.

In accordance with yet another representative embodiment, a MEMS device comprises: a plurality of vias in a plurality of via layers; a plurality of metal features in a plurality of metal layers; the plurality of via layers interleaved with the plurality of metal layers, the plurality of via layers and the plurality of metal layers disposed in an insulating layer; a void region disposed in the insulating layer; a contact pad disposed in the insulating layer at a top surface of the insulating layer; and a sealing structure over the void region, the sealing structure substantially sealing the void region, wherein at least a portion of the sealing structure is above a top surface of the contact pad. A first set of one or more volume portions of the void region may be disposed in one or more of the via layers, and a second set of one or more volume portions of the void region may be disposed in one or more of the metal layers. The MEMS device may have a transistor below the plurality of via layers and the plurality of metal layers. A first set of metal features and a second set of vias may form an interconnect structure between a top surface of a gate of the transistor and a bottom surface of the contact pad. At least a portion of the transistor may be formed in a substrate. The substrate may be disposed below the insulating layer. A passivation layer may be disposed over a metal feature of the upper-most metal layer. A first metal feature may comprise an active membrane. A second metal feature may comprise a reference membrane. The active membrane and the reference membrane may comprise elements of a pressure sensor, an acoustic sensor, and/or a resonator.

In an embodiment, a micro-electromechanical system (MEMS) device includes an insulating layer over a substrate, the insulating layer including a plurality of first layers and a plurality of second layers interleaved with the plurality of first layers; a first plurality of conductive vias in the plurality of first layers of the insulating layer; a first plurality of metal features in the plurality of second layers of the insulating layer; a first void region in the insulating layer, the first void region comprising a first set of openings in the plurality of first layers and a second set of openings in the plurality of second layers; a first contact pad disposed in the insulating layer at a top surface of the insulating layer; and a first sealing structure over the first void region, the first sealing structure sealing the first void region.

In an embodiment, a micro-electromechanical system (MEMS) device includes a substrate; an insulating layer over the substrate, the insulating layer including a plurality of first layers and a plurality of second layers interleaved with the plurality of first layers, the plurality of first layers having via structures formed therein, the plurality of second layers having metal structures formed therein; a first void region in the insulating layer, the first void region comprising a first set of openings and a second set of openings, the second set of openings being connected to and interleaved with the first set of openings, each of the first set of openings and the second set of openings being in a different layer of the insulating layer; a first sealing structure over at least a portion of the insulating layer, the first sealing structure sealing the first void region to form an encloses space; a first metal membrane in the insulating layer and under the first void region; and a second metal membrane in the insulating layer and above at least a portion of the first void region.

In an embodiment, a micro-electromechanical system (MEMS) device includes an insulating layer over a substrate, the insulating layer comprising first layers and second layers interleaved with the first layers; a void region in the insulating layer, the void region comprising first set of openings in the first layer and second set of openings in the second layers, where the first set of openings and the second set of openings are connected and form a continuous opening; a seal structure over the insulating layer, the seal structure sealing the void region to form an enclosed cavity; an active membrane embedded in a first portion of the insulating layer, where an upper surface of the first portion of the insulating layer contacts the seal structure, and is exposed to an ambient air, and where a lower surface of the first portion of the insulating layer is exposed to the enclosed cavity; and a reference membrane in the insulating layer and under the void region.

Benefits, other advantages, and solutions to problems have been described with regard to specific embodiments; however, benefits, advantages, solutions to problems, and any component(s) that may cause any benefit, advantage, or solution to occur or become more pronounced are not to be construed as a critical, required, or essential feature or component.

As used herein, the terms "comprises," "comprising," "includes," "including," "has," "having," or any contextual variant thereof, are intended to cover a non-exclusive inclusion. For example, a process, product, article, or apparatus that comprises a list of elements is not necessarily limited to only those elements, but may include other elements not expressly listed or inherent to such process, product, article, or apparatus. Furthermore, unless expressly stated to the contrary, "or" refers to an inclusive or and not an exclusive or. That is, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term, unless the context clearly indicates otherwise. Also, as used in the description herein, the meaning of "in" includes "in" and "on," unless the context clearly indicates otherwise.

Examples or illustrations provided herein are not to be regarded in any way as restrictions on, limits to, or express definitions of any term or terms with which they are associated. Instead, these examples or illustrations are to be regarded as being described with respect to one particular embodiment and as merely illustrative. Those skilled in the art will appreciate that any term or terms with which these examples or illustrations are associated will encompass other embodiments that may or may not be given therewith or elsewhere in the specification, and all such embodiments are intended to be included within the scope of that term or terms. Language designating such non-limiting examples and illustrations includes, but is not limited to: "for example," "for instance," "e.g.," "in a representative embodiment," or "in one embodiment." Reference throughout this specification to "one embodiment," "an embodiment," "a representative embodiment," "a particular embodiment," or "a specific embodiment," or contextually similar terminology, means that a particular feature, structure, property, or characteristic described in connection with the embodiment is included in at least one embodiment and may not necessarily be present in all embodiments. Thus, respective appearances of the phrases "in one embodiment," "in an embodiment," or "in a specific embodiment," or similar terminology in various places throughout this specification are not necessarily referring to the same embodiment. Furthermore, particular features, structures, properties, or characteristics of any specific embodiment may be combined in any suitable manner with one or more other embodiments.

Spatially relative terms, such as "under," "below," "lower," "upper," "above," "higher," "adjacent," "interadjacent," "interposed," "between," or the like, may be used herein for ease of description to representatively describe one or more elements or features in relation to other elements or features as representatively illustrated in the Figures. Spatially relative terms are intended to encompass different orientations of the device in use or operation, in addition to orientations illustrated in the Figures. An apparatus or device may be otherwise spatially transformed (e.g., rotated by 90 degrees) and the spatially relative descriptors used herein may likewise be transformed accordingly.

Although steps, operations, or procedures are presented in a specific order, this order may be changed in different embodiments. In some embodiments, to the extent multiple steps are shown as sequential in the specification or claims, some combination of such steps in alternative embodiments may be performed at the same time or in a different order. The sequence of operations described herein may be interrupted, suspended, or otherwise controlled by another process.

Although representative embodiments and their advantages have been described in detail, it should be understood that various changes, substitutions, and alterations may be made herein without departing from the spirit and scope of the disclosure as included by the appended claims. Moreover, the scope of the present disclosure is not intended to be limited to the particular embodiments of any process, product, machine, manufacture, assembly, apparatus, composition of matter, means, methods, or steps described in the specification. As one skilled in the art will readily appreciate from the disclosure, various processes, products, machines, manufacture, assemblies, apparatuses, compositions of matter, means, methods, or steps, whether presently existing or later developed, that perform substantially the same function or achieve substantially the same result as the corresponding representative embodiments described herein may be utilized according to the disclosure herein. The appended claims are intended to include within their scope such processes, products, machines, manufacture, assemblies, apparatuses, compositions of matter, means, methods, or steps.

What is claimed is:

1. A micro-electromechanical system (MEMS) device, comprising:
   an insulating layer over a substrate, the insulating layer comprising a plurality of first layers and a plurality of second layers interleaved with the plurality of first layers;
   a first plurality of conductive vias in the plurality of first layers of the insulating layer;
   a first plurality of metal features in the plurality of second layers of the insulating layer;
   a first void region in the insulating layer, the first void region being an empty space, the first void region comprising a first set of openings in the plurality of first layers and a second set of openings in the plurality of second layers;
   a first contact pad disposed in the insulating layer at a top surface of the insulating layer; and
   a first sealing structure over the first void region, the first sealing structure sealing the first void region.

2. The MEMS device of claim 1, wherein the first set of openings is connected with the second set of openings.

3. The MEMS device of claim 2, wherein the first set of openings and the second set of openings form a continuous opening.

4. The MEMS device of claim 2, wherein each of the first set of openings is disposed in a respective one of the plurality of first layers, and wherein the each of the first set of openings has a same size as a conductive via in the respective one of the plurality of first layers.

5. The MEMS device of claim 1, further comprising a first transistor below the insulating layer.

6. The MEMS device of claim 5, wherein the first plurality of conductive vias and the first plurality of metal features are between a top surface of a gate of the first transistor and a bottom surface of the first contact pad.

7. The MEMS device of claim 1, further comprising:
   a first membrane in the insulating layer, the first membrane comprising a conductive material, the first membrane being between the first void region and the substrate; and
   a second membrane in the insulating layer, the second membrane comprising the conductive material, the second membrane being disposed above the first membrane, at least a portion of the first void region being between the first membrane and the second membrane.

8. The MEMS device of claim 7, wherein an upper surface of the second membrane, a lower surface of the second membrane, and sidewalls of the second membrane are covered by a first portion of the insulating layer, wherein an upper surface of the first portion of the insulating layer is closer to the substrate than an upper surface of the first contact pad.

9. The MEMS device of claim 7, wherein the second membrane is laterally disposed between a first portion of the first void region and a second portion of the first void region.

10. The MEMS device of claim 1, further comprising:
    a second void region in the insulating layer, the second void region comprising a third set of openings in the plurality of first layers and a fourth set of openings in the plurality of second layers;
    a second contact pad disposed in the insulating layer at the top surface of the insulating layer;
    a second sealing structure over the second void region, the second sealing structure sealing the second void region; and
    a metal cap over the second void region, wherein a portion of the insulating layer is between the metal cap and the second void region.

11. The MEMS device of claim 10, further comprising a passivation layer over the metal cap, wherein at least a portion of the passivation layer is between the metal cap and the second sealing structure.

12. A micro-electromechanical system (MEMS) device, comprising:
   a substrate;
   an insulating layer over the substrate, the insulating layer comprising a plurality of first layers and a plurality of second layers interleaved with the plurality of first layers, the plurality of first layers having via structures formed therein, the plurality of second layers having metal structures formed therein;
   a first void region in the insulating layer, the first void region being a cavity in the insulating layer, the first void region comprising a first set of openings and a second set of openings, the second set of openings being connected to and interleaved with the first set of openings, each of the first set of openings and the second set of openings being in a different layer of the insulating layer;
   a first sealing structure over at least a portion of the insulating layer, the first sealing structure sealing the first void region to form an enclosed cavity;
   a first metal membrane in the insulating layer and under the first void region; and
   a second metal membrane in the insulating layer and above at least a portion of the first void region.

13. The MEMS device of claim 12, wherein the first set of openings is in the plurality of first layers, and the second set of openings is in the plurality of second layers.

14. The MEMS device of claim 12, further comprising:
   a first metal pad in the insulating layer, wherein an upper surface of the first metal pad is exposed by the insulating layer; and
   a first interconnect structure in the insulating layer, the first interconnect structure comprising a first set of conductive vias and a second set of metal features interleaved with the first set of conductive vias, wherein the first interconnect structure is electrically coupled between the first metal pad and a transistor in the substrate, wherein the first interconnect structure is electrically coupled to the first metal membrane or the second metal membrane.

15. The MEMS device of claim 12, further comprising:
   a second void region in the insulating layer, the second void region comprising a third set of openings connected with a fourth set of openings interleaved with the third set of openings;
   a second sealing structure over at least a portion of the insulating layer, the second sealing structure sealing the second void region; and
   a first metal pattern surrounded by a first portion of the insulating layer, wherein the first portion of the insulating layer is between an upper surface of the second void region and a lower surface of the second void region.

16. The MEMS device of claim 15, wherein a second portion of the insulating layer is disposed over the second void region, wherein the MEMS device further comprises a metal cap over the second portion of the insulating layer.

17. The MEMS device of claim 15, further comprising:
   a second metal pad in the insulating layer proximate an upper surface of the insulating layer; and
   a second interconnect structure in the insulating layer, the second interconnect structure comprising a third set of conductive vias and a fourth set of metal structures interleaved with the third set of conductive vias, wherein the second interconnect structure is electrically coupled to the second metal pad and the first metal pattern.

18. A micro-electromechanical system (MEMS) device, comprising:
   an insulating layer over a substrate, the insulating layer comprising first layers and second layers interleaved with the first layers;
   a void region in the insulating layer, the void region being a cavity that is free of the insulating layer, the void region comprising first set of openings in the first layers and second set of openings in the second layers, wherein the first set of openings and the second set of openings are connected and form a continuous opening;
   a seal structure over the insulating layer, the seal structure sealing the void region to form an enclosed cavity;
   an active membrane embedded in a first portion of the insulating layer, wherein an upper surface of the first portion of the insulating layer contacts the seal structure, and is exposed to an ambient air, and wherein a lower surface of the first portion of the insulating layer is exposed to the enclosed cavity; and
   a reference membrane in the insulating layer and under the void region.

19. The MEMS device of claim 18, wherein the active membrane and the reference membrane comprise a same electrically conductive material.

20. The MEMS device of claim 18, further comprising:
   a conductive pad at an upper surface of the insulating layer; and
   an interconnect structure in the insulating layer and under the conductive pad, wherein the interconnect structure is electrically coupled to the conductive pad and at least one of the reference membrane and the active membrane.

* * * * *